US012726716B2

(12) United States Patent
Cheng et al.

(10) Patent No.: US 12,726,716 B2
(45) Date of Patent: Sep. 1, 2026

(54) IMAGE SENSOR FOR SENSING LED LIGHT WITH REDUCED FLICKERING

(71) Applicant: Taiwan Semiconductor Manufacturing Co., Ltd., Hsin-Chu (TW)

(72) Inventors: Yun-Wei Cheng, Taipei City (TW); Chun-Hao Chou, Tainan City (TW); Kuo-Cheng Lee, Tainan City (TW); Hsin-Chi Chen, Tainan City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 422 days.

(21) Appl. No.: 18/364,873

(22) Filed: Aug. 3, 2023

(65) Prior Publication Data

US 2023/0403474 A1 Dec. 14, 2023

Related U.S. Application Data

(62) Division of application No. 17/521,267, filed on Nov. 8, 2021, now Pat. No. 11,956,553, which is a division (Continued)

(51) Int. Cl.

*H04N 23/745* (2023.01)
*H04N 23/73* (2023.01)

(Continued)

(52) U.S. Cl.

CPC ........... *H04N 23/745* (2023.01); *H04N 23/73* (2023.01); *H04N 25/40* (2023.01); *H10F 39/182* (2025.01);

(Continued)

(58) Field of Classification Search

CPC ...... H04N 23/745; H04N 23/73; H04N 25/40; H04N 25/44; H04N 25/585; H04N 25/70;

(Continued)

(56) References Cited

U.S. PATENT DOCUMENTS 5,018,006 A 5/1991 Hashimoto
5,714,753 A * 2/1998 Park ..................... H10F 39/802 250/214 R (Continued)

FOREIGN PATENT DOCUMENTS

CN 104854476 8/2015
CN 106057833 10/2016

(Continued)

*Primary Examiner* — Yogeshkumar Patel
(74) *Attorney, Agent, or Firm* — HAYNES AND BOONE, LLP

(57) ABSTRACT

An image sensor device has a first number of first pixels disposed in a substrate and a second number of second pixels disposed in the substrate. The first number is substantially equal to the second number. A light-blocking structure disposed over the first pixels and the second pixels. The light-blocking structure defines a plurality of first openings and second openings through which light can pass. The first openings are disposed over the first pixels. The second openings are disposed over the second pixels. The second openings are smaller than the first openings. A microcontroller is configured to turn on different ones of the second pixels at different points in time.

20 Claims, 9 Drawing Sheets

Related U.S. Application Data of application No. 16/264,212, filed on Jan. 31, 2019, now Pat. No. 11,172,142.

(60) Provisional application No. 62/735,886, filed on Sep. 25, 2018.

(51) Int. Cl.

| | |
|---|---|
| ***H04N 25/40*** | (2023.01) |
| ***H10F 39/00*** | (2025.01) |
| ***H10F 39/12*** | (2025.01) |
| ***H10F 39/18*** | (2025.01) |

(52) U.S. Cl.

CPC ....... *H10F 39/199* (2025.01); *H10F 39/8023* (2025.01); *H10F 39/8033* (2025.01); *H10F 39/8053* (2025.01); *H10F 39/8057* (2025.01); *H10F 39/807* (2025.01)

(58) Field of Classification Search

CPC ..... H04N 25/42; H10F 39/182; H10F 39/199; H10F 39/8023; H10F 39/8033; H10F 39/8053; H10F 39/8057; H10F 39/807; H10F 39/8027; H10F 39/8037

See application file for complete search history.

(56) References Cited

U.S. PATENT DOCUMENTS 6,137,100 A * 10/2000 Fossum ................ H04N 25/134 348/277
6,235,549 B1 5/2001 Bawolek et al.
6,867,549 B2 * 3/2005 Cok ..................... G09G 3/3225 345/589
6,885,398 B1 4/2005 Sladen
7,095,441 B2 8/2006 Nagano
7,126,633 B2 10/2006 Saito
7,564,115 B2 7/2009 Chen et al.
7,633,165 B2 12/2009 Hsu et al.
7,667,749 B2 2/2010 Han
7,821,553 B2 10/2010 Ellis-Monaghan
7,825,024 B2 11/2010 Lin et al.
7,973,413 B2 7/2011 Kuo et al.
8,105,875 B1 1/2012 Hu et al.
8,158,456 B2 4/2012 Chen et al.
8,183,578 B2 5/2012 Wang
8,183,579 B2 5/2012 Wang
8,227,902 B2 7/2012 Kuo
8,278,152 B2 10/2012 Liu et al.
8,405,442 B2 3/2013 Chen
8,426,961 B2 4/2013 Shih et al.
8,436,671 B2 5/2013 Chern et al.
8,448,100 B1 5/2013 Lin et al.
8,598,508 B2 12/2013 Kanai et al.
8,601,416 B2 12/2013 Kuo et al.
8,610,488 B2 12/2013 Yu et al.
8,625,240 B2 1/2014 Chung et al.
8,631,372 B2 1/2014 Yu et al.
8,669,174 B2 3/2014 Wu et al.
8,669,780 B2 3/2014 Chi
8,701,073 B1 4/2014 Fu et al.
8,754,818 B2 6/2014 Yen et al.
8,762,900 B2 6/2014 Shin et al.
8,775,993 B2 7/2014 Huang et al.
8,802,504 B1 8/2014 Hou et al.
8,803,292 B2 8/2014 Chen et al.
8,803,316 B2 8/2014 Lin et al.
8,847,659 B1 9/2014 Lan et al.
8,887,116 B2 11/2014 Ho et al.
9,571,760 B2 2/2017 Kang et al.
9,679,939 B1 6/2017 Cheng et al.
10,136,084 B1 11/2018 Solheim et al.
10,250,832 B1 4/2019 Xu et al.
10,257,448 B1 4/2019 Tower et al.
10,748,945 B2 8/2020 Oka
2002/0044209 A1 4/2002 Saito
2003/0122948 A1 7/2003 Uya et al.
2004/0105021 A1 6/2004 Hu
2004/0174754 A1 9/2004 Lee et al.
2005/0062863 A1 3/2005 Takeuchi et al.
2007/0035653 A1 2/2007 Hong et al.
2008/0049133 A1 2/2008 Bock
2009/0167893 A1 * 7/2009 Susanu ..................... G06T 5/92 348/E9.051
2010/0002118 A1 1/2010 Wang et al.
2010/0110271 A1 * 5/2010 Yanagita ............ H10F 39/8057 257/E31.127
2010/0225791 A1 9/2010 Nakayama
2010/0283998 A1 11/2010 Souchkov et al.
2011/0273596 A1 11/2011 Egawa
2012/0074329 A1 3/2012 Granfors et al.
2012/0200749 A1 8/2012 Boettiger et al.
2012/0206326 A1 8/2012 Nakamura et al.
2012/0307104 A1 * 12/2012 Kanai .................. H10F 39/182 348/E9.002
2013/0076723 A1 3/2013 Niioka et al.
2013/0193311 A1 8/2013 Yoshida
2013/0193981 A1 8/2013 Chen et al.
2013/0246990 A1 9/2013 Yen et al.
2013/0320553 A1 12/2013 Kuo et al.
2014/0001645 A1 1/2014 Lin et al.
2014/0043148 A1 2/2014 Wang et al.
2014/0077057 A1 3/2014 Chao et al.
2014/0078366 A1 * 3/2014 Dokoutchaev ....... H04N 25/133 348/302
2014/0092939 A1 4/2014 Chang et al.
2014/0101623 A1 4/2014 Chen et al.
2014/0126089 A1 5/2014 Chang et al.
2014/0126274 A1 5/2014 Lee et al.
2014/0167799 A1 6/2014 Wang et al.
2014/0191195 A1 7/2014 Sundaram et al.
2014/0195728 A1 7/2014 Hsu et al.
2014/0201692 A1 7/2014 Chen et al.
2014/0203397 A1 7/2014 Yen et al.
2014/0211438 A1 7/2014 Lin et al.
2014/0225258 A1 8/2014 Chiu et al.
2014/0232914 A1 8/2014 Awatani
2014/0237435 A1 8/2014 Chen et al.
2014/0239427 A1 8/2014 Huang et al.
2014/0252572 A1 9/2014 Hou et al.
2014/0253754 A1 9/2014 Papiashvili
2014/0264772 A1 9/2014 Horng et al.
2014/0266273 A1 9/2014 Wang et al.
2014/0266386 A1 9/2014 Huang et al.
2014/0282337 A1 9/2014 Yuh et al.
2014/0304670 A1 10/2014 Su et al.
2014/0310675 A1 10/2014 Liu et al.
2014/0325464 A1 10/2014 Hsu et al.
2014/0339615 A1 11/2014 Wang et al.
2014/0362260 A1 * 12/2014 Wang .................. H04N 25/623 348/241
2015/0028393 A1 * 1/2015 Tomita ................ H10F 39/8057 257/222
2015/0041942 A1 2/2015 Ebiko et al.
2015/0054997 A1 * 2/2015 Hynecek ............ H10F 39/1825 257/292
2015/0084144 A1 * 3/2015 Suzuki .................. H04N 25/76 438/70
2015/0146067 A1 * 5/2015 Roh ..................... H04N 25/133 348/308
2015/0163423 A1 6/2015 Yin et al.
2015/0163427 A1 * 6/2015 Rotte ..................... H04N 25/53 250/208.1
2015/0179695 A1 * 6/2015 Lyu ..................... H10F 39/8027 257/292
2015/0221796 A1 8/2015 Smith et al.
2015/0228689 A1 8/2015 Lenchenkov
2015/0244926 A1 8/2015 Inoue
2016/0019329 A1 * 1/2016 Eldesouki ............ G06T 3/4053 716/124
2016/0150165 A1 * 5/2016 Grauer .................. H04N 25/58 348/308
2016/0150199 A1 5/2016 Wu et al.

(56) References Cited

U.S. PATENT DOCUMENTS

| | | | |
|---|---|---|---|
| 2017/0077163 | A1 | 3/2017 | Chou et al. |
| 2017/0078594 | A1 | 3/2017 | Kawabata et al. |
| 2017/0104910 | A1 | 4/2017 | Kimura et al. |
| 2017/0104942 | A1 | 4/2017 | Hirota et al. |
| 2017/0213863 | A1 | 7/2017 | Qian et al. |
| 2017/0324917 | A1 | 11/2017 | Mlinar |
| 2017/0359539 | A1 | 12/2017 | Kawabata et al. |
| 2017/0366726 | A1 | 12/2017 | Yanagida et al. |
| 2018/0027196 | A1 | 1/2018 | Yang et al. |
| 2018/0316845 | A1 | 11/2018 | Ouyang |
| 2018/0359400 | A1 | 12/2018 | Ogina et al. |
| 2019/0096928 | A1* | 3/2019 | Okuda .................... H10F 30/22 |
| 2019/0281226 | A1 | 9/2019 | Wang et al. |
| 2019/0288020 | A1 | 9/2019 | Ikuma et al. |
| 2020/0020730 | A1* | 1/2020 | Mlinar ................ H10F 39/8027 |
| 2020/0045227 | A1* | 2/2020 | Jiang .................... H04N 25/583 |
| 2020/0403015 | A1* | 12/2020 | Suzuki .................. H10F 39/807 |
| 2021/0281732 | A1 | 9/2021 | Koizumi et al. |
| 2021/0281737 | A1 | 9/2021 | Iwase et al. |
| 2021/0356597 | A1 | 11/2021 | Hurwitz et al. |

FOREIGN PATENT DOCUMENTS

| | | |
|---|---|---|
| CN | 106549025 | 3/2017 |
| CN | 106997884 | 8/2017 |
| CN | 207369146 | 5/2018 |
| KR | 20160062725 | 6/2016 |
| TW | 201721854 | 6/2016 |
| TW | 201642451 | 12/2016 |
| TW | 201735383 | 10/2017 |
| TW | 201743438 | 12/2017 |
| WO | WO-2018105474 | 6/2018 |

* cited by examiner

IMAGE SENSOR FOR SENSING LED LIGHT WITH REDUCED FLICKERING

PRIORITY DATA

This application is a divisional application to U.S. Application No. 17,521,267, filed Nov. 8, 2021, entitled "Image Sensor for Sensing LED Light with Reduced Flickering", which is a divisional application to U.S. Application No. 16,264,212 filed Jan. 31, 2019, entitled "Image Sensor for Sensing LED Light with Reduced Flickering", issued on Nov. 9, 2021 as U.S. Pat. No. 11,172,142, which claims priority to Provisional U.S. Application No. 62/735,886, filed Sep. 25, 2018, the disclosures of each of which are herein incorporated by reference in their respective entireties.

BACKGROUND

The semiconductor integrated circuit (IC) industry has experienced rapid growth. Technological advances in IC materials and design have produced generations of ICs where each generation has smaller and more complex circuits than the previous generation. Among other applications, semiconductor ICs may be used to implement image sensors to sense radiation such as light. For example, complementary metal-oxide-semiconductor (CMOS) image sensors (CIS) and charge-coupled device (CCD) sensors are widely used in various applications such as digital still camera or mobile phone camera applications. These devices utilize an array of pixels (which may include photodiodes and transistors) in a substrate to absorb (i.e., sense) radiation that is projected toward the substrate and convert the sensed radiation into electrical signals.

However, conventional semiconductor image sensor devices may still have various shortcomings. For example, image sensor devices have pixels that are selectively turned on and off for repeating cycles, where the pixels are configured to collect light when they are turned "on" but not when they are turned "off". While this type of operation is fine in most situations, it may present a problem with respect to light sources that also have a pulsing nature. For example, light-emitting diode (LED) devices may have "on" and "off" periods within each pulse cycle. The LED devices may emit light during the "on" period but does not emit light during the "off" period. As such, if the pulse frequency of the image sensor device is not synched with the pulse frequency of the LED device, the image sensor device may capture "flicking" images of the LED device. In other words, the light from the LED appears as though it is "flickering" to the image sensor device, even though the human eye may still observe a steady or continuously turned-on LED. When the flickering effect is produced, it is not only visually displeasing but could also be dangerous, for example in automotive applications where image sensors are used to monitor a vehicle's surroundings, such as traffic signals or other signs that use LED light sources.

Therefore, while existing semiconductor image sensors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
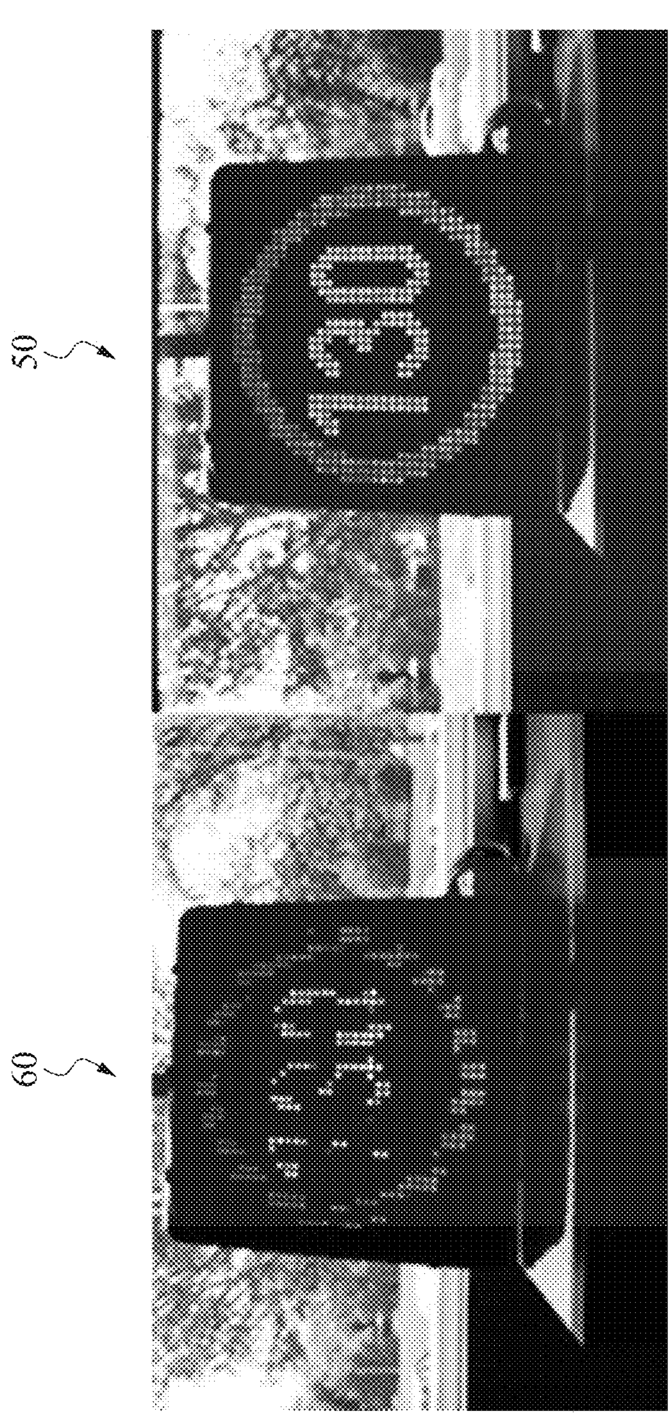
FIG. 1 includes images that illustrate a flickering effect.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Rapid advancements in the semiconductor industry have led to the proliferation of semiconductor devices in many fields. As an example, semiconductor devices have been made into image sensors, which can replace or supplement the functionality of mechanically-oriented optical devices. For example, a semiconductor image sensor device may include an array or grid of pixels for sensing and recording an intensity of radiation (such as light) directed toward the semiconductor image sensor device. In various implementations, a semiconductor image sensor device may include a charge-coupled device (CCD), complementary metal oxide semiconductor (CMOS) image sensor (CIS), an active-pixel sensor (APS), or a passive-pixel sensor, etc.

During an operation of a semiconductor image sensor device, each of its pixels may be turned "on" or "off" periodically. During the "on" period (also referred to as an integration period), the pixels collect light that is projected toward the image sensor device. The collected light is converted into electrical signals. During the "off" period, the image sensor device processes the electrical signals to generate a captured image. The "on" and "off" periods of the image sensor device may define an operating frequency of the image sensor device.

While this type of operation for image sensor devices generally works well for most situations, it may not be optimal for sensing light that may also be pulsing. For example, a light-emitting diode (LED) may emit light at a particular pulsing frequency, where the LED emits light during an "on" period but does not emit light during an "off" period. The operating frequency of an image sensor device may not be the same as a pulsing frequency of an LED whose emitted light is supposed to be captured by the image sensor device. When this occurs, the "on" period (during which the image sensor device captures light) of the image sensor device and the "on" period (during which the LED emits light) of the LED may not always be synchronized. In other words, there may be time periods in which the LED is turned on and is emitting light, but unfortunately the image sensor device may be turned off during these time periods. As a result, the light emitted by the LED is not always captured by the image sensor device, or is only intermittently captured by the image sensor device. The imperfect capturing of the LED light by the image sensor device may product a flickering effect.

For example, the flickering effect is visually illustrated in FIG. 1 with reference to images 50 and 60. In the non-limiting example shown in FIG. 1, the image 50 includes an output of an LED device captured by an imaging device. The imaging device may be a mechanically-based camera (e.g., one that does not employ image sensor devices to capture images), or it may be an image sensor device whose operating frequency happens to be "in sync" with the pulsing frequency of the LED device. In any case, the image 50 illustrates a clearly captured output of the LED device, which in this case is the number "130" surrounded by a circle or a ring. It is understood that the number "130" and the ring surrounding it may be comprised of a plurality of individual LEDs, which are selectively illuminated in order to form the collective output of the LED device.

In comparison, the image 60 may illustrate an output of the LED device that is captured by an image sensor device whose operating frequency is not in sync with the pulsing frequency of the LED device. As such, there may be cycles where the pixels of the image sensor device are turned off (i.e., not capturing light), even though the LED device is turned off and is emitting light. Conversely, there may also be cycles where the pixels of the image sensor device are turned off (i.e., capturing light), but the LED device is turned on and is not emitting light. As a result, the image sensor device captures a partial or incomplete output of the LED device, which makes it difficult to read or understand the intended output of the LED device. This partial or incomplete output of the LED device may also vary from time to time. In other words, the image sensor device may capture a first incomplete output of the LED device at a first point in time, but the image sensor device capture a second incomplete output of the LED device at a second point in time. The overall result may appear as if the LED device is displaying a "flickering" output to the image sensor device, even though the LED device's output appears constant or continuous to a human eye.

The flickering effect is not only visually displeasing, but it may also be problematic in real world situations such as in automotive applications. For example, a self-driving vehicle may rely on image sensor devices to capture the images within and/or surrounding the vehicle. The sources of light captured by the image sensor devices may include light generated by LEDs, for example light from traffic signals and/or instrument panel displays. The flickering effect may render the captured image unusable, which means that the image sensor device may need to recapture the image. Or worse, the self-driving vehicle may make a wrong decision based on the sub-optimally captured image (e.g., reading a wrong LED output number or misinterpreting a traffic signal), which could interfere with the intended operation and/or compromise the safety of the vehicle.

To overcome the problems discussed above, the present disclosure implements, on an image sensor device, "small" pixels that have a lower quantum efficiency (QE) than the standard pixels. The lower QE allows these small pixels to have a longer integration time (i.e., when they are turned on) without being overexposed. A microcontroller controls the on and off times of the small pixels and the standard pixels such that, when a first one of the small pixels is turned off, a second one of the small pixels is turned on, and vice versa. In this manner, at least one of the small pixels is turned on at all times during an operation of the image sensor device, which allows the light output from LEDs to be captured at all times. In other words, even if the standard pixels "miss" capturing the output of the LED device at a given point in time due to not being synched with the LED device, at least one of the small pixels can still capture the light emitted by the LED at that given point in time. Consequently, the image sensor device of the present disclosure can substantially reduce or eliminate the flickering effect. The various aspects of the present disclosure are now discussed below in more detail with reference to FIGS. 1-9.

Figure 2:
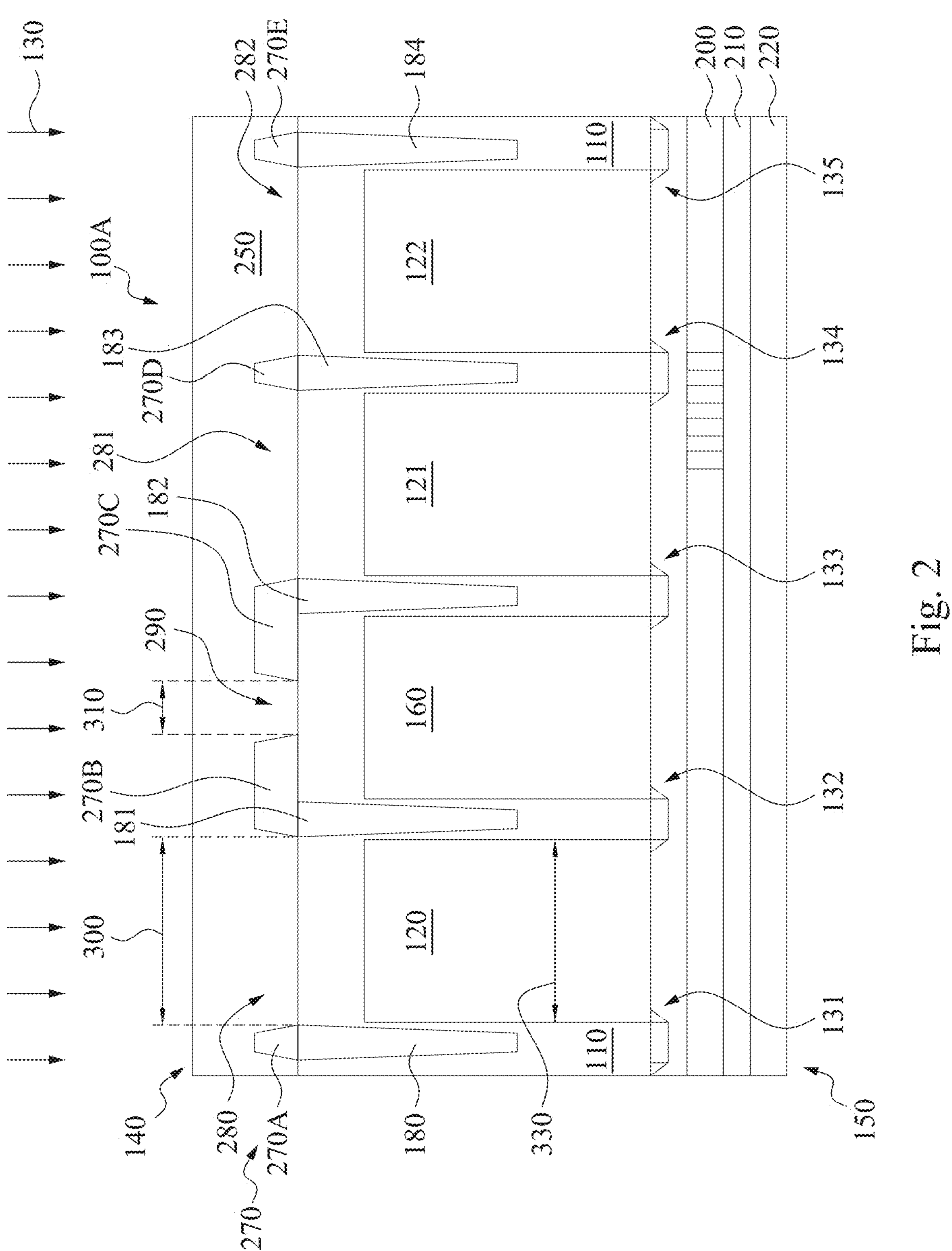
FIG. 2 illustrates a diagrammatic fragmentary cross-sectional view of an image sensor device according to embodiments of the present disclosure.

Referring now to FIG. 2, a fragmentary cross-sectional side view of an image sensor device 100A is illustrated. The image sensor device 100A includes a device substrate 110. In some embodiments, the device substrate 110 contains a silicon material doped with a p-type dopant such as boron (for example a p-type substrate). Alternatively, the device substrate 110 could contain another suitable semiconductor material. For example, the device substrate 110 may include silicon that is doped with an n-type dopant such as phosphorous or arsenic (an n-type substrate). The device substrate 110 could also contain other elementary semiconductors such as germanium and diamond. The device substrate 110 could optionally include a compound semiconductor and/or an alloy semiconductor. Further, the device substrate 110 could include an epitaxial layer (epi layer), may be strained for performance enhancement, and may include a silicon-on-insulator (SOI) structure.

Radiation-sensing regions—for example, pixels 120,121, and 122—are formed in the device substrate 110. The pixels 120-122 are configured to sense radiation (or radiation waves), such as an incident light 130, that is projected toward device substrate 110 from a side 140. The incident light 130 would enter the device substrate 110 through the side 140 and be detected by one or more of the pixels 120-122. The pixels 120-122 each include a photodiode in the present embodiment. In other embodiments, the pixels 120-122 may include components such as pinned layer photodiodes, photogates, reset transistors, source follower transistors, and transfer transistors. The gate structures 131-135 of these transistors are shown in FIG. 2 as non-limiting examples. The gate structures 131-135 may each include a gate dielectric, a gate electrode, and gate spacers formed on sidewalls of the gate dielectric and the gate electrode. In some embodiments, the gate structures 131-135 are configured to transfer the image data captured by the corresponding pixels 120-122 and 160 to an external circuitry. The doped regions of the pixels 120-122 may be formed by one or more implantation processes from a side 150 opposite the side 140. Alternatively, the doped regions of the pixels 120-122 may also be formed by one or more diffusion processes.

The pixels 120-122 may serve as the primary light-sensors of the image sensor device 100A and may also be referred to as "standard" pixels. For the sake of simplicity, three "standard" pixels 120-122 are illustrated in FIG. 2, but it is understood that any number of "standard" pixels may be implemented in the device substrate 110.

In addition to the "standard" pixels such as the pixels 120-122, the image sensor device 100A further includes a plurality of "small" pixels that are also configured to capture radiation such as the light 130. For reasons of simplicity, an example one of the small pixels is shown in FIG. 2 as the pixel 160, which is also formed in the substrate 110, but it is understood that the image sensor device may include a plurality of other pixels similar to the pixel 160. These other pixels (similar to the pixel 160) may be interspersed throughout the substrate 110, for example each "small" pixel similar to the pixel 160 may be located among a plurality of other "standard" pixels such as the pixels 120-122. A total number of the "small" pixels may be substantially less than a total number of the "standard" pixels. For example, for every "small" pixel, there may be two or more "standard" pixels.

In some embodiments, the formation of the pixel 160 is similar to the formation of the pixels 120-122. For example, the doped region of the pixel 160 may also be formed by one or more implantation or diffusion processes. However, the pixel 160 has a lower QE compared to the pixels 120-122. The lower QE may be achieved in a variety of ways, such as by configuring the doping concentration level of the pixels 120-122 and 160 differently, or by configuring the physical sizes/volumes of the pixels 120-122 and 160 differently, or by allowing different amounts or types of light to be captured by the pixels 120-122 and 160. The lower QE allows the pixel 160 to be turned on for a longer period without being overexposed, which facilitates the capturing of the LED light, as discussed in greater detail below.

Still referring to FIG. 2, a plurality of isolation structures such as isolation structures 180-184 are formed in the device substrate 110. The isolation structures 180-184 provide electrical and optical isolation between the pixels 120-122 and 160. For example, due to the presence of the isolation structures 180-184, light that is intended to be captured by any given pixel is less likely to propagate into a neighboring/adjacent pixel, thereby reducing optical cross-talk between the pixels. The isolation structures 180-184 also prevent the pixels 120-122 and 160 from being electrically shorted together. In some embodiments, the isolation structures 180-184 include deep isolation trenches (DTIs), which may include an optically dark or optically reflective dielectric material.

An interconnect structure 200 is formed over the substrate 110 (and over the pixels 120-122 and 160 formed therein) on the side 150. The interconnect structure 200 includes a plurality of patterned dielectric layers and conductive layers that provide interconnections (e.g., wiring) between the various doped features, circuitry, and input/output of the image sensor device 100A. For example, the interconnect structure 200 includes an interlayer dielectric (ILD) and contacts, vias and metal lines that are electrically isolated by the ILD. The contacts, vias, and metal lines may include conductive materials such as aluminum, aluminum/silicon/copper alloy, copper, copper alloy, titanium, titanium nitride, tantalum, tantalum nitride, tungsten, polysilicon, metal silicide, or combinations thereof.

A passivation layer 210 is disposed over the interconnect structure 200. The passivation layer 210 protects the components of the image sensor device 100A from elements such as dust, moisture, etc. In some embodiments, the passivation layer 210 contains a dielectric material, such as silicon oxide, silicon nitride, silicon oxynitride, etc.

The image sensor device 100A also includes a substrate 220 that is bonded to the device substrate 110, for example through the passivation layer 210 and the interconnect structure 200. In other words, the interconnect structure 200 and the passivation layer 210 are located between the device substrate 110 and the substrate 220. The substrate 220 may be bonded to the device substrate 110 by molecular forces—a technique known as direct bonding or optical fusion bonding—or by other bonding techniques known in the art, such as metal diffusion or anodic bonding.

In some embodiments, the substrate 220 is a carrier substrate that may include a silicon material or a glass material. The carrier substrate may provide mechanical strength and support when the device substrate 110 is thinned. For example, in embodiments where the image sensor device 100A includes a back-side illuminated image sensor—where the sides 140 and 150 respectively correspond to the back side and the front side—the device substrate 110 may undergo a thinning process from the side 140. The thinning process may include a mechanical grinding process and a chemical thinning process. A substantial amount of substrate material may be first removed from the device substrate 110 during the mechanical grinding process. Afterwards, the chemical thinning process may apply an etching chemical to the side 140 of the device substrate 110 to further thin the device substrate 110 to an acceptably small thickness, which may be on the order of a few microns or less. The thinned device substrate 110 allows the pixels formed therein to have better light detection performance (especially in darker environments) and improved electrical and optical isolation therebetween.

In some embodiments, the substrate 220 may also contain electrical circuitry, for example electrical circuitry for an application-specific integrated circuit (ASIC). The electrical circuitry may be electrically coupled to the components of the device substrate 110 (e.g., to the pixels 120-122 and 160) through the interconnect structure 200 and/or other through-substrate vias/contacts. As such, the substrate 220 may also be referred to as an ASIC substrate. It is understood that the ASIC substrate may also be capable of providing the mechanical strength and support during the thinning of the device substrate 110.

Still referring to FIG. 2, a passivation layer 250 is formed over the device substrate 110 on the side 140. The passivation layer 250 also protects the components of the image sensor device 100A from elements such as dust, moisture, etc. Since the light 130 needs to propagate through the passivation layer 250 to reach the pixels 120-122 and 160, the passivation layer 250 is transparent. In some embodiments, the passivation layer 250 contains a dielectric material, such as silicon oxide, silicon nitride, silicon oxynitride, etc.

Figure 3:
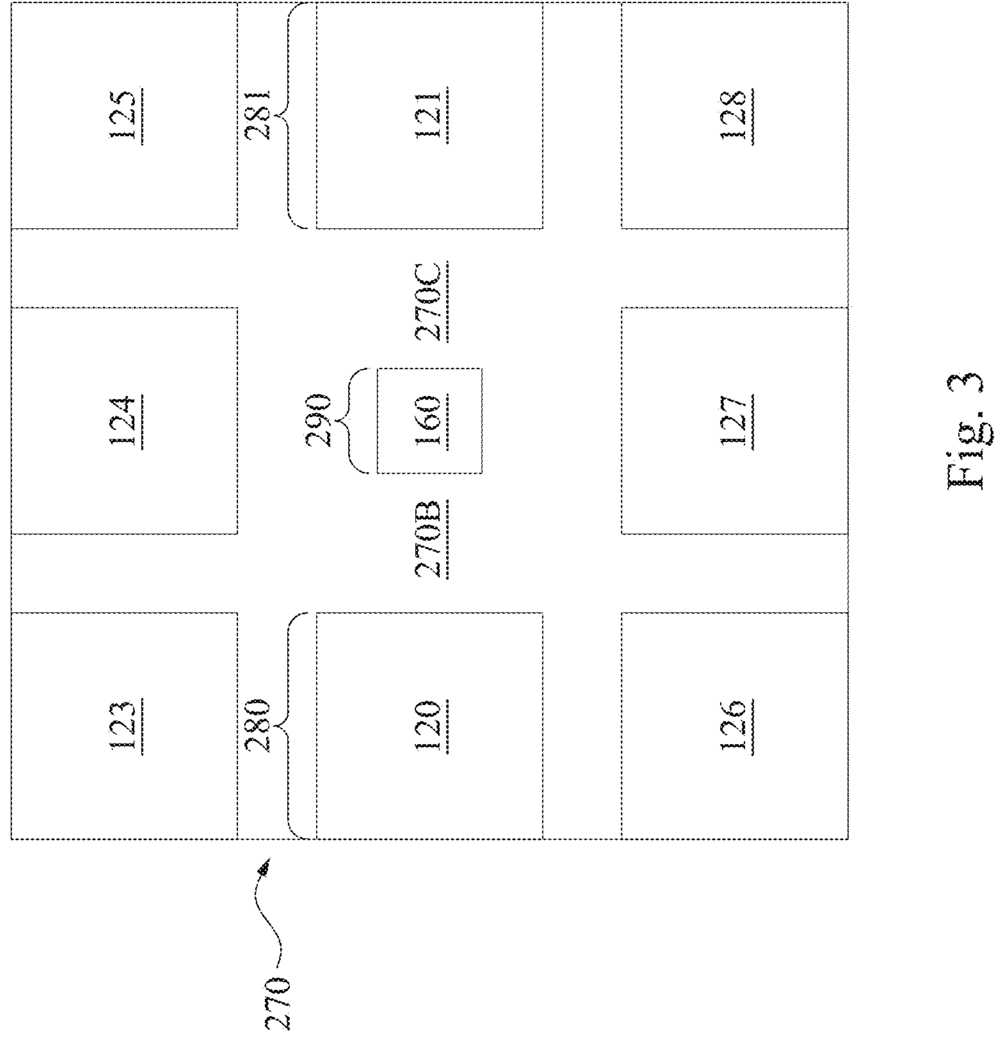
FIG. 3 illustrates a diagrammatic fragmentary top view of an image sensor device according to embodiments of the present disclosure.

A grid structure 270 is embedded in the passivation layer 250. Portions 270A, 270B, 270C, 270D, and 270E of the grid structure 270 are located over the isolation structures 180-184, respectively. To facilitate the understanding of the grid structure 270, a fragmentary top view of a portion of the grid structure 270 is also shown in FIG. 3. For example, FIG. 3 illustrates the top views of the pixels 120-121 and 160 shown in FIG. 2, as well as neighboring pixels 123-128 that are similar to the pixels 120-121 (e.g., the "standard" pixels). The grid structure 270 defines a plurality of openings, such as openings 280-282 and 290 that are at least partially vertically aligned with the pixels 120-122 and 160, respectively. In other words, each of the pixels 120-128 and 160 is at least partially exposed by a respective opening defined by the grid structure 270. In some embodiments, the pixels 120-128 may be at least partially offset from the respective openings defined by the grid structure 270 as well.

The grid structure 270 has a material composition that is optically opaque and/or reflective of radiation (e.g., the light 130). In some embodiments, the grid structure 270 has a metal material composition. In other embodiments, the grid structure 270 has a dielectric material composition that is optically opaque. Since the light 130 cannot pass through the grid structure 270, the grid structure 270 can control the amount of light received by each of the pixels below by configuring the size of the openings aligned with each pixel. For example, the opening 280 (defined at least in part by the portions 270A and 270B of the grid structure 270) exposes a substantial majority (or even an entirety) of the pixel 120, and thus the pixel 120 receives a first amount of light.

In comparison, the opening 290 (defined at least in part by the portions 270B and 270C of the grid structure 270) exposes a small portion of the pixel 160, and thus the pixel 160 receives a second amount of light that is substantially less than the first amount received by the pixel 120. In some embodiments, the amount of light received by each pixel may be correlated with the size of the respective opening aligned with the pixel. For example, the opening 280 has a lateral dimension 300, and the opening 290 has a lateral dimension 310. According to embodiments of the present disclosure, the lateral dimension 300 is greater than the dimension 310, for example by at least five times. As such, the amount of light received by the pixel 120 is at least twice the amount of light received by the pixel 160, which causes the pixel 160 to have a lower QE than the pixel 120. As discussed above, the lower QE of the pixel 160 allows it to be turned on for a longer period of time, which facilitates the capturing of LED light with a pulsing frequency.

Instead of (or in addition to) restricting the amount of light being received by the pixel 160, the present disclosure also offers other ways to reduce the QE of the pixel 160. For example, the pixel 160 may be formed to have a different dopant/doping concentration level than the pixels 120-122. Since QE is determined at least in part by the doping concentration level of the pixel, the QE of the pixel 160 may be configured to be lower than the QE of the pixels 120-122, for example by lowering the doping concentration level of the pixel 160 in some embodiments, or raising the doping concentration level of the pixel 160 in other embodiments.

Figure 4:
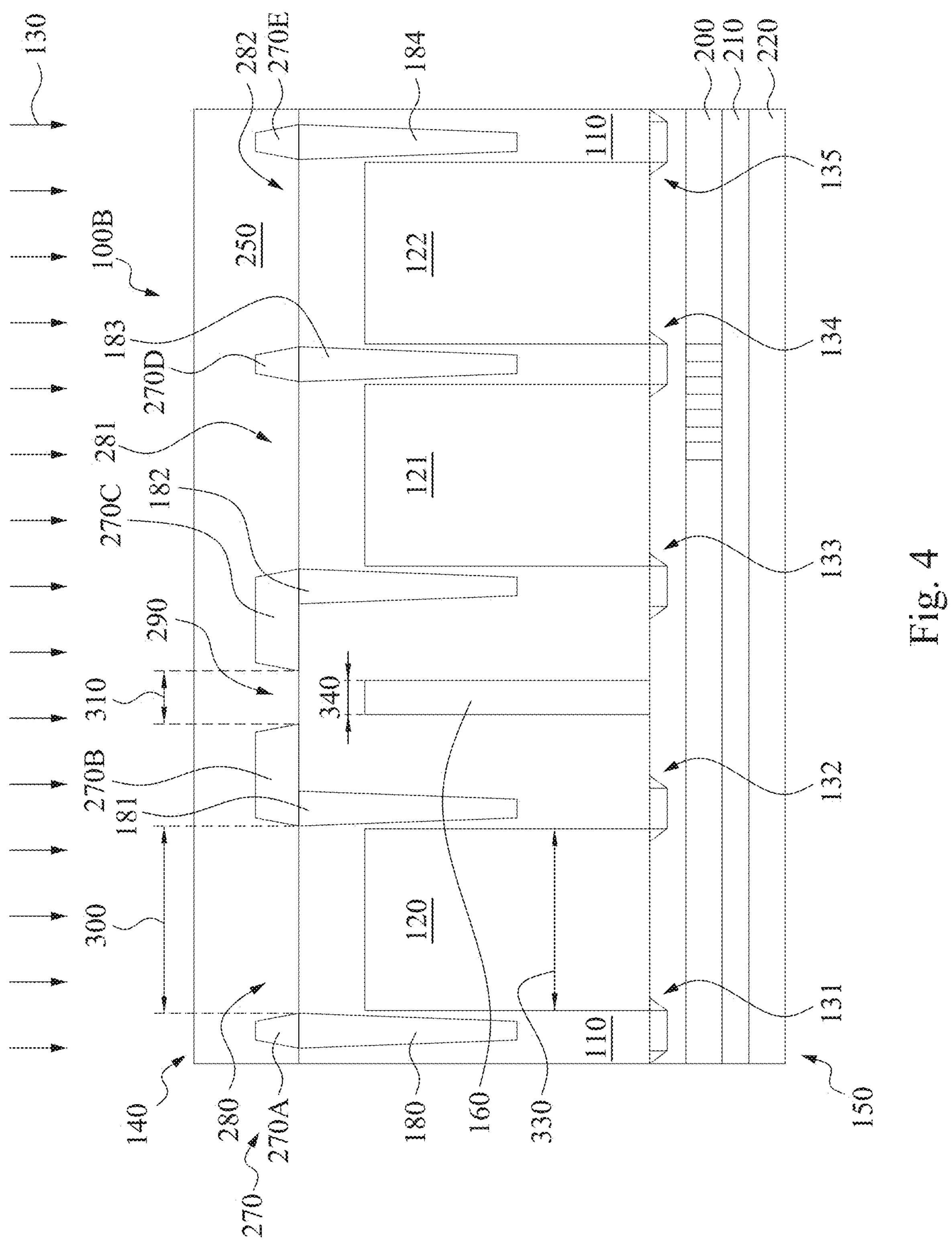
FIGS. 4-6 illustrate diagrammatic fragmentary cross-sectional side views of an image sensor device according to embodiments of the present disclosure.

Referring now to FIG. 4, another embodiment of the image sensor device of the present disclosure is illustrated as an image sensor device 100B, which also offers reduced QE for the pixel 160. For reasons of consistency and clarity, similar components appearing in both FIG. 2 and FIG. 4 are labeled the same. One difference between the image sensor device 100A in FIG. 2 and the image sensor device 100B in FIG. 4 is that the pixel 160 in the image sensor device 100B is substantially smaller in size than the pixel 160 in the image sensor device 100A. For example, whereas the pixel 160 may have a similar size as the pixels 120-122 in the image sensor device 100A, the pixel 160 in the image sensor device 100B is substantially smaller in size than each of the pixels 120-122. As shown in FIG. 4, the pixels 120-122 may each have a lateral dimension 330, whereas the pixel 160 may have a lateral dimension 340 that is substantially smaller than the lateral dimension 330 (e.g., at least 50% smaller). In some embodiments, the smaller size of the pixel 160 can be achieved by configuring a mask used in the implantation process to implant dopants into the substrate 110 in the pixel formation process. For example, the mask may have greater openings for the pixels 120-122 but a smaller opening for the pixel 160, where dopants are implanted through the openings to define the size of the pixels 120-122 and 160.

The smaller size of the pixel 160 corresponds to a smaller amount of light that can be collected by the pixel 160. As such, even if the grid structure 270 does not specifically define a smaller opening 290 for the pixel 160, the smaller size of the pixel 160 means that it will still have a lower QE than the other pixels 120-122.

Figure 5:
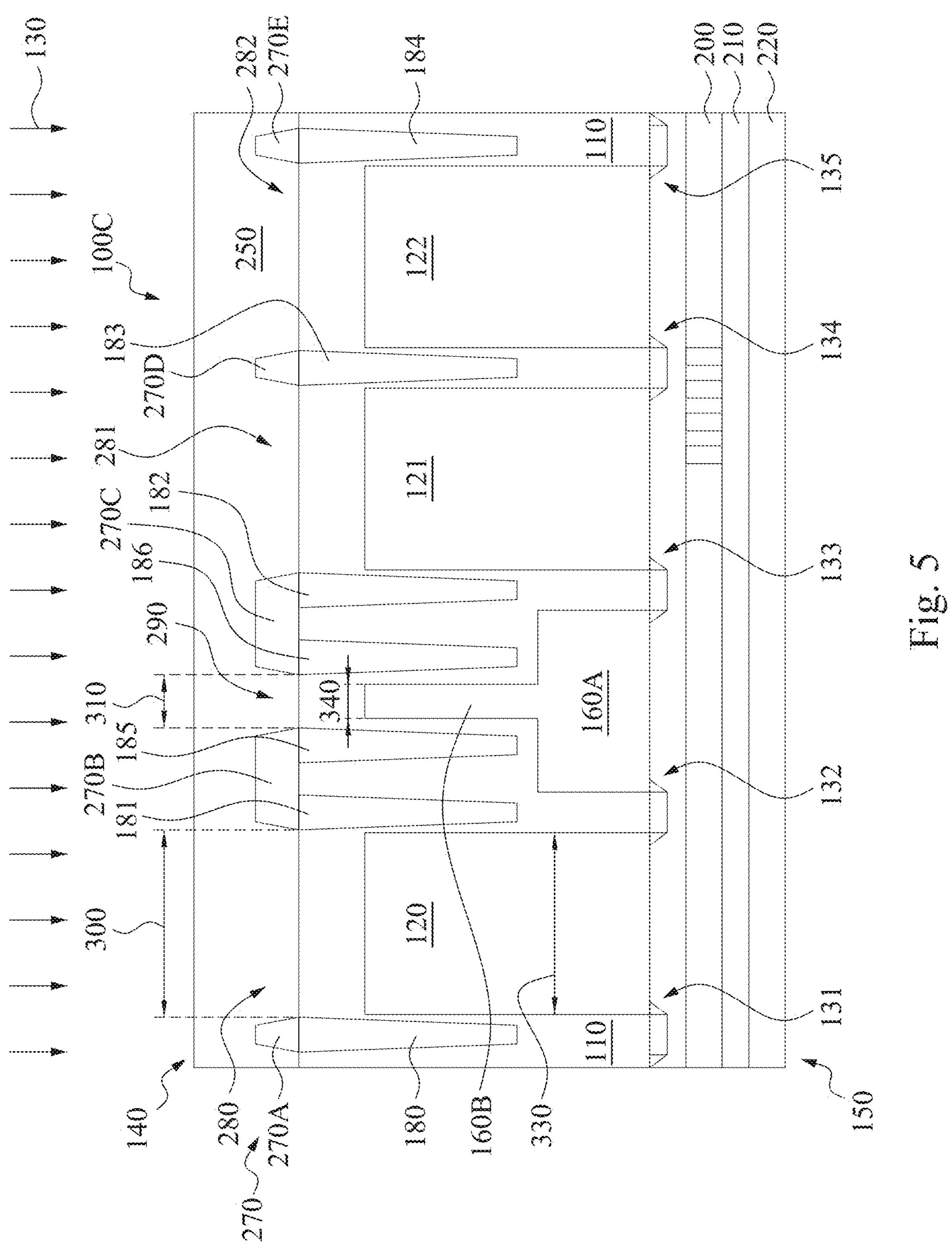

Another embodiment of the image sensor device is illustrated in FIG. 5 as image sensor device 100C. The image sensor device 100C is similar to image sensor device 100A and 100B and may be viewed as a combination of the image sensor device 100A and 100B. In more detail, instead of a pixel 160 having a substantially uniform lateral dimension, the pixel 160 in FIG. 5 has two (or more) portions, such as a portion 160A and a portion 160B that is narrower than the portion 160A. This type of geometric profile of the pixel 160 may be achieved by using two (or more) implantation processes to form the pixel 160, for example using one implantation process to form the portion 160A and using another implantation process to form the portion 160B. The smaller portion 160A means that the pixel 160 still receives less light and therefore has a lower QE than the pixels 120-122.

In addition, the image sensor device 100C implements multiple isolation structures 181 and 185 between the pixel 120 and the pixel 160, as well as multiple isolation structures 186 and 182 between the pixel 121 and the pixel 160. The multiple isolation structures further reduces optical cross-talk between the pixels and helps guide the light to be received by their intended pixels.

Figure 6:
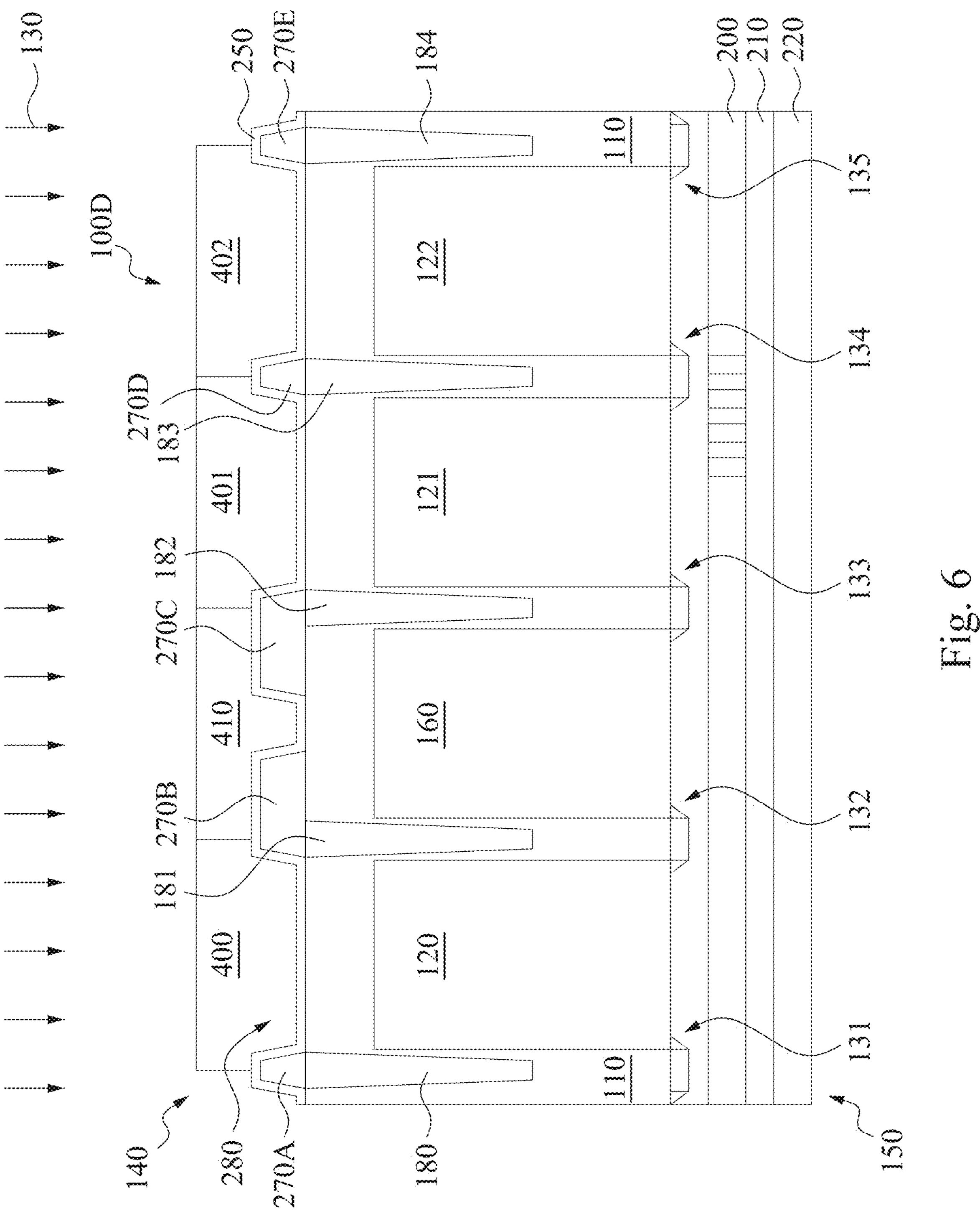

Yet another embodiment of the image sensor device is illustrated in FIG. 6 as image sensor device 100D. As shown in FIG. 6, color filters such as color filters 400-402 and 410 are implemented in the image sensor device 100D. The color filters 400-402 and 410 are formed over the passivation layer 250 and are vertically aligned with the pixels 120-122 and 160, respectively. The color filters 400-402 and 410 may contain an organic material and may be formed by one or more coating and lithography processes.

The color filters 400-402 and 410 may also be associated with different colors. For example, the color filter 400 is a red color filter and may allow a red light to pass through but will filter out all the other colors of light. The color filter 401 is a blue color filter and may allow a blue light to pass through but will filter out all the other colors of light. The color filter 402 is a green color filter and may allow a green light to pass through but will filter out all the other colors of light. The color filter 410 may be a grey color filter in the illustrated embodiment, which may be more absorptive with respect to various spectra of light than the color filters 400-402. Note that the grey color filter is merely a non-limiting example of a broader band (e.g., broader than just the red, blue, and green bands) non-RGB color filter, and in other embodiments, different types of broader band color filters may be implemented instead. Due to the differences between the color filter 410 and the color filters 400-402, the pixel 160 has a lower QE than the pixels 120-122. In some embodiments, the color filter 410 causes the pixel 160 to have a QE that is less than 5%.

Figure 7:
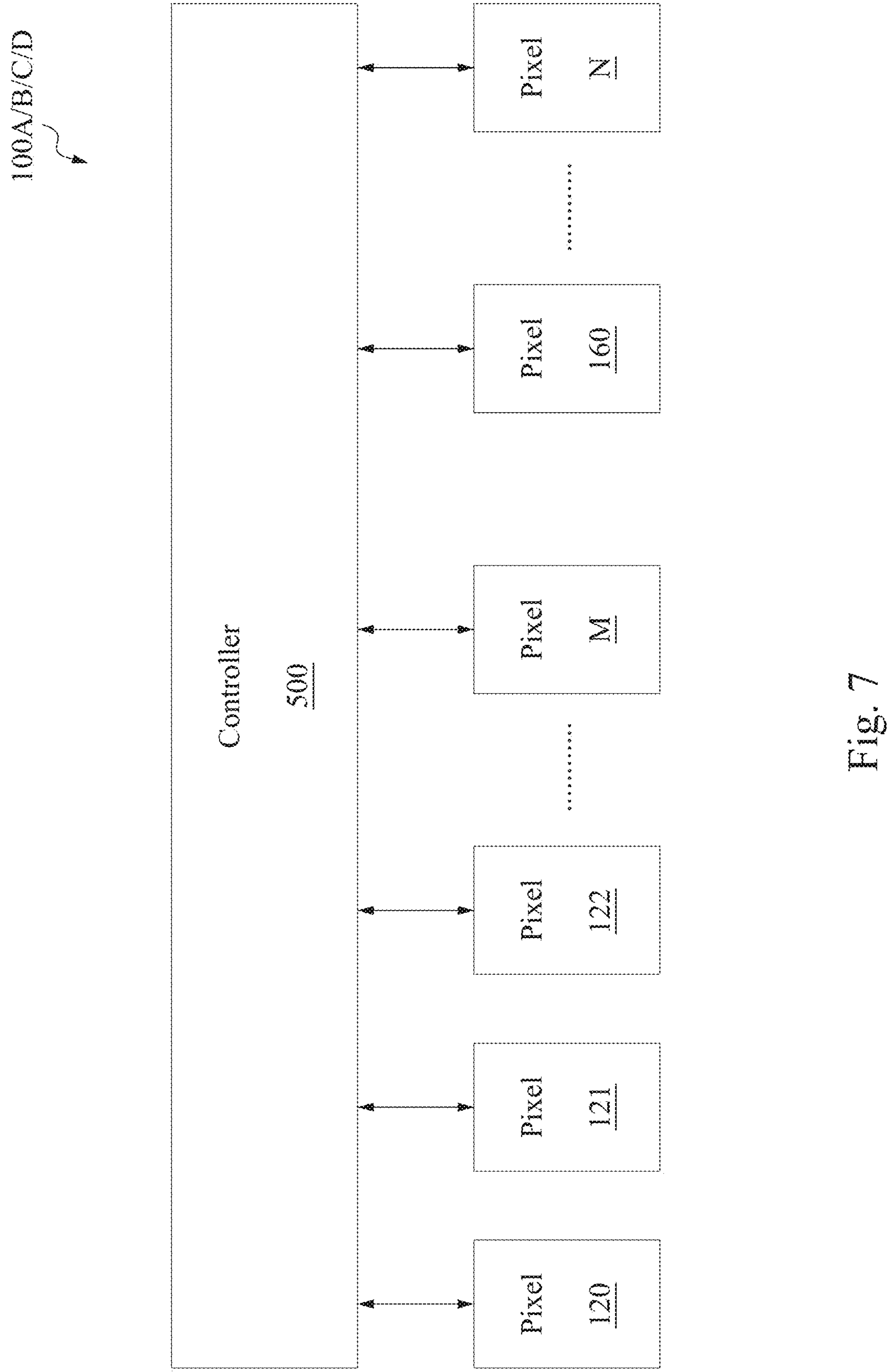
FIG. 7 illustrates a block diagram of a portion of an image sensor device according to embodiments of the present disclosure.

FIG. 7 illustrates a simplified block diagram of a portion of the image sensor device 100A/B/C/D of the present disclosure. The image sensor device 100A/B/C/D includes a controller 500, for example a microcontroller. The controller 500 may be implemented on the device substrate 110 in some embodiments or may be implemented on the substrate 220 (e.g., when the substrate includes an ASIC) in other embodiments. The controller 500 is electrically coupled to the pixels 120-122 and a plurality of other "standard" pixels similar to the pixels 120-122, such as pixel M. The controller 500 is also electrically coupled to the pixel 160 and a plurality of other "small" pixels similar to the pixel 160, such as pixel N. In some embodiments, the image sensor device 100A/B/C/D may include a first number of pixels 120 through M and a second number of pixels 160 through N. In some embodiments, the first number is substantially equal to the second number, meaning that there may be about the same numbers of "standard" pixels and "small" pixels. In some other embodiments, the first number is greater than the second number. For example, the first number may be at least two times greater than the second number, meaning that there are many more of the "standard" pixels than the "small" pixels. In some other embodiments, the first number is smaller than the second number. For example, the first number may be about ½ of the second number, meaning that there are fewer of the "standard" pixels than the "small" pixels.

As discussed above, the pixels 120 through M are pixels having a greater QE, while the pixels 160 through N are pixels having a lower QE. In various embodiments, the lower QE may be achieved through a smaller grid opening to let less light pass through and reach the pixels 160 through N, or by forming the pixels 160 through N to have smaller photosensitive regions than the pixels 120 through M, or by configuring the color filter of the pixels 160 through N to be more absorptive to light (e.g., grey color filters or other broader band color filters) than the color filters of the pixels 120 through M.

It is understood that the pixels 120 through M may be considered the primary pixels for the image sensor device 100A/B/C/D, since most of the image capturing is performed by these pixels, while the pixels 160 through N may be considered the secondary pixels for the image sensor device 100A/B/C/D, since they mostly facilitate in the image capturing operation by capturing images when the pixels 120 through N cannot.

This is explained in more detail with reference to FIG. 8, which illustrates a simplified example timing diagram 800. The timing diagram 800 includes a pulse 810 of an LED device, a pulse 820 of a "standard" pixel (e.g., the pixels 120-122), a pulse 830 of a first small pixel (e.g., one of the pixels 160), and a pulse 840 of a second small pixel (e.g., another one of the pixels 160). The pulses 810-840 each have an X-axis component and a Y-axis component. The X-axis represents time, whereas the Y-axis represents magnitude or amplitude of each of the pulses 810-840.

As discussed above, LED devices typically emit light periodically and thus may be "pulsing". This is shown in FIG. 8, where the pulse 810 of the LED has "on" period s 810A, 810C, 810E, and 810G, with the "off" periods 810B, 810D, and 810F disposed between the "on" periods. The LED device emits light during the "on" periods but does not emit light during the "off" periods. Since the emission of light is periodic, it may be said that the LED device has a light-emitting frequency, for example a frequency of F1.

The pulse 820 of the "standard" pixels has "on" periods 820A, 820C, and 820E (also referred to as integration periods) where the "standard" pixels detect light, as well as "off" periods 820B, 820D, and 820F where the "standard" pixels do not detect light. The turning on and off of each of the "standard" pixels is performed by the controller 500 of FIG. 7 and has a frequency F2. It is understood that although the length of the "on" periods 820A/820C/820E does not appear to be substantially different from the length of the "off" periods 820B/820D/820F in FIG. 8, this may not be drawn to scale. In actual operation of the image sensor device, the length of the "on" periods 820A/820C/820E may be substantially shorter than the length of the "off" periods 820B/820D/820F, for example multiple times shorter. This may be done to avoid overexposing the pixels, as well as to give the image sensor device sufficient time to process the captured signals during the "off" periods.

The "standard" pixels can capture light emitted from the LED device perfectly if the frequencies F1 and F2 are the same and the pulses 810 and 820 are phase-synched (e.g., having "on" periods at the same time). Unfortunately, this situation is rare and typically does not occur. More realistically, the frequencies F1 and F2 are not identical (or even if they are identical, the pulses 810 and 820 are not phase-synched). For example, as shown in FIG. 8, the pulse 810 has a greater frequency F1 than the frequency F2 of the "standard" pixels, since the cycles of the "on" and "off" periods occur faster for the pulse 810. In this example, when the LED device is emitting light during the "on" period 810A, the "standard" pixels can adequately capture the emitted LED light, since the "standard" pixels are activated during the "on" period 820A as well, meaning the "on" periods 810A and 820A substantially overlap.

However, when the LED device is emitting light during the "on" period 810C, the "standard" pixels do not fully capture the emitted LED light, since the "standard" pixels are activated (e.g., the beginning of the "on" period 820C) after much of the "on" period 810C has elapsed. The small overlap between the "on" periods 810C and 820C could result in an inaccurate image capture of the LED device. The situation is even worse when the LED device is emitting light during the "on" periods 810E or 810G, since the "standard" pixels are turned off (i.e., in the "off" periods 820D or 820F) at this time. Therefore, no LED image can be captured during this period. The incomplete or inaccurate image capture of the LED device may result in the flickering effect discussed above. In addition, the relatively short "on"

periods (compared to the "off" periods) of the "standard" pixels may exacerbate this problem, since the time window for image capturing is short.

The present disclosure overcomes the flickering problem by implementing two or more "small" pixels (e.g., the pixel 160) having lower QE. The lower QE allows the "small" pixels to stay turned on for a much longer period of time without getting over exposed. For example, as shown in FIG. 8, the first "small" pixel has an "on" period 830A and an "off" period "830B", while the second "small" pixel has an "off" period 840A and an "on" period "840B". Compared to the "on" periods 820A, 820C, and 820E of the "standard" pixels, the "on" periods "830A" and "840B" of the "small" pixels are substantially longer, for example several times longer. In some embodiments, the "on" periods "830A" and "840B" of the "small" pixels are about 2-100 times longer than the "on" periods of the "standard" pixels. The longer "on" periods of the "small" pixels allow them to capture LED light when the "standard" pixels cannot. For example, when the LED device is emitting light during the "on" period 810C, the first "small" pixel is also turned on during the period "830A". As such, the first "small" pixel can capture the LED light even though the "Standard" pixels may have trouble doing so.

The controller 500 also selectively turns on and off the "small" pixels such that when the first "small" pixel is turned on, the second "small" pixel is turned off, and vice versa. Therefore, when the LED device is emitting light during the "on" period 810G, the second "small" pixel is also turned on during the period "840B", even though the "standard" pixels and the first "small" pixel are turned off during this time. In some embodiments, the controller 500 ensures that at least one of the "small" pixels is turned on at all times during an operation of the image sensor device. In this manner, at least one of the "small" pixels will be able to capture the LED light at all times, even if all the other "standard" pixels and the other "small" pixels are turned off.

Based on the above, it can be seen that the "small" pixels of the image sensor device are each selectively activated or turned on and off at a frequency F3 that is substantially lower (e.g., at least several times lower) than the frequency F2 at which the "standard" pixels are each turned on and off. In some embodiments, the frequency F2 is at least several times faster or greater than the frequency F3. For example, the frequency F2 may be about 2-100 times faster than the frequency F3. The slower frequency F3 of the "small" pixels allows its "on" period to be longer so as to capture multiple pulses of the LED light. In some embodiments, the controller 500 may determine a frequency F1 of the LED device, and based on the determination, it may set the frequency F3 for turning on and off the "small" pixels at a value that is less than ½ of the frequency F1. For example, if the LEDs have a frequency F1 that is 100 Hz, then the controller 500 may set the frequency F3 of the "small" pixels to be less than 50 Hz (and could be much lower than 50 Hz in actual implementation). This allows each pulse of the "small" pixels to capture two or more pulses of the LED device.

It is understood that although two "small" pixels are used herein to illustrate the concept of the present disclosure, three or more "small" pixels may be used in actual implementation of the image sensor device as well. This may be helpful when the "off" period of the "small" pixels is substantially longer than the "on" periods of the "small" pixels. In these embodiments, a first "small" pixel may be turned on, followed by a second "small" pixel, then a third "small" pixel, so on and so forth, until the first "small" pixel is turned on again.

Figure 8:
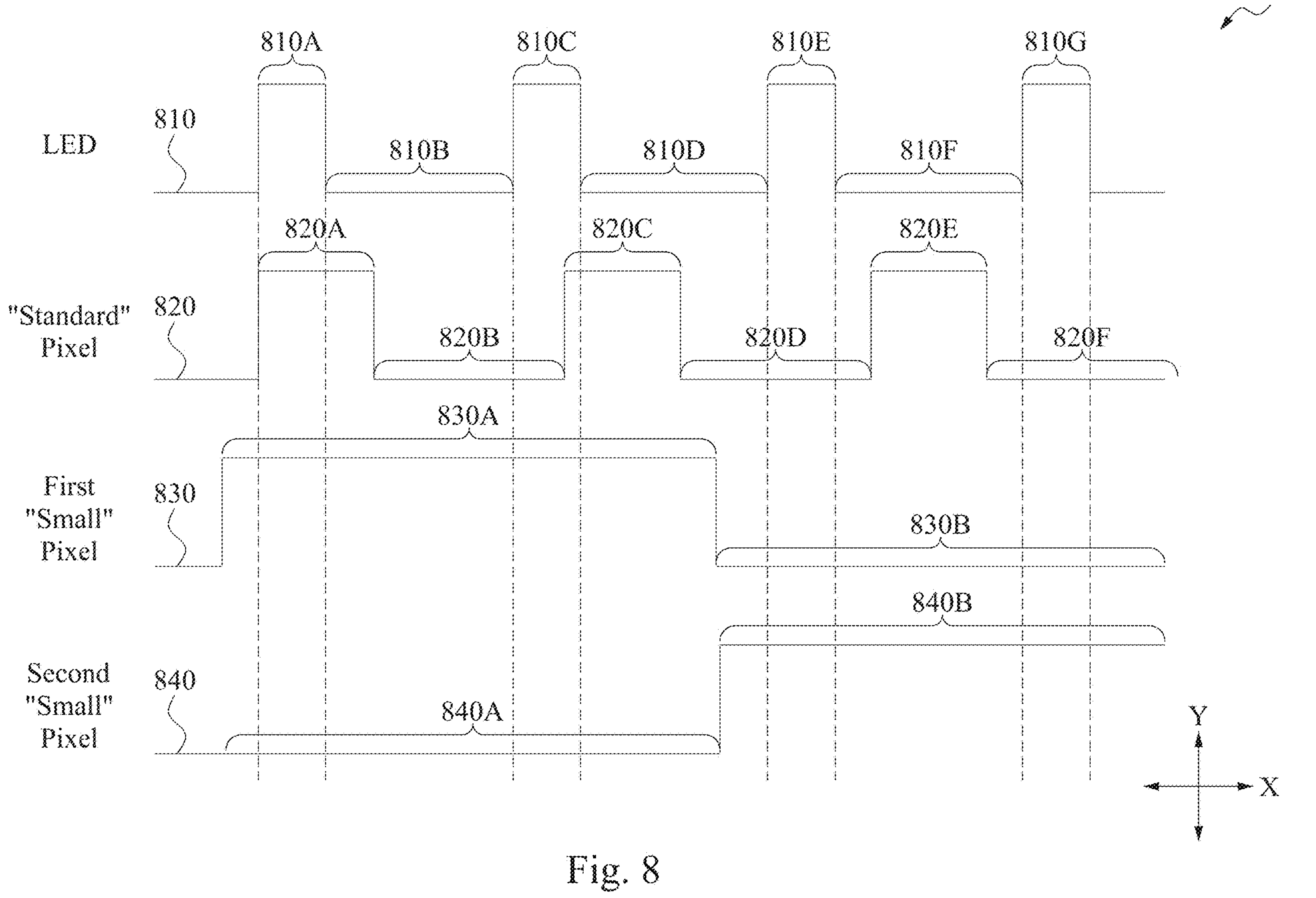
FIG. 8 illustrates a timing diagram illustrating an operation of an image sensor device according to embodiments of the present disclosure.

It is also understood that even though FIG. 8 shows the first "small" pixel and the second "small" pixel as having exactly opposite "on" and "off" periods, it is not intended to be limiting. In other embodiments, the first "small" pixel and the second "small" pixel may also have at least partially overlapping "on" periods and/or at least partially overlapping "off" periods for reasons of redundancy.

It is further understood that although the present disclosure uses LED light as an example, the image sensor device discussed herein may be used to capture light from other types of devices that produce pulsing light. In other words, whereas any device that emit light based on an on/off cycle may present flickering problems for conventional image sensors, the image sensor of the present disclosure can accurately capture the images of these light-emitting devices with no or very little distortion.

For reasons of simplicity, not all of the fabrication processes associated with the formation of the image sensor devices 100A-100D are discussed in detail herein. However, it is understood that the fabrication of the image sensor devices 100A-100D may follow a backside illuminated (BSI) image sensor flow. For example, the gate structures 131-135 may be formed over the device substrate 110 by various patterning processes, the photosensitive regions such as pixels 120-122 and 160 may be formed in the device substrate 110 through ion implantation processes, and the interconnect structure 200 may be formed by a plurality of patterning/deposition/polishing processes on the "front" side 150 of the device substrate 110. The passivation layer 210 may be formed on the interconnect structure 200. The "front" side 150 of the device substrate 110 is then bonded with the carrier substrate 220, such that the interconnect structure 200 and the passivation layer 210 are located between the device substrate 110 and the carrier substrate 220. A backside grinding process may then be performed from the "back" side 140 of the device substrate 110, where various mechanical and/or chemical processes are performed to "thin down" the device substrate 110 to an acceptable thickness level, which may be in a range between about 2 microns and about 100 microns. After the "thin down process" is performed, the grid structure 270 and the color filters 400-402 and 410 may be formed on the "back" side 140 of the device substrate 110. Although not shown herein for reasons of simplicity, micro-lenses may also be formed over the color filters 400-402 and 410. As non-limiting examples, the details of the BSI fabrication process flow may be found in U.S. Pat. Nos. 9,385,156, 8,736,006, 8,772,899, the disclosures of each of which are hereby incorporated by reference herein in their respective entireties.

Figure 9:
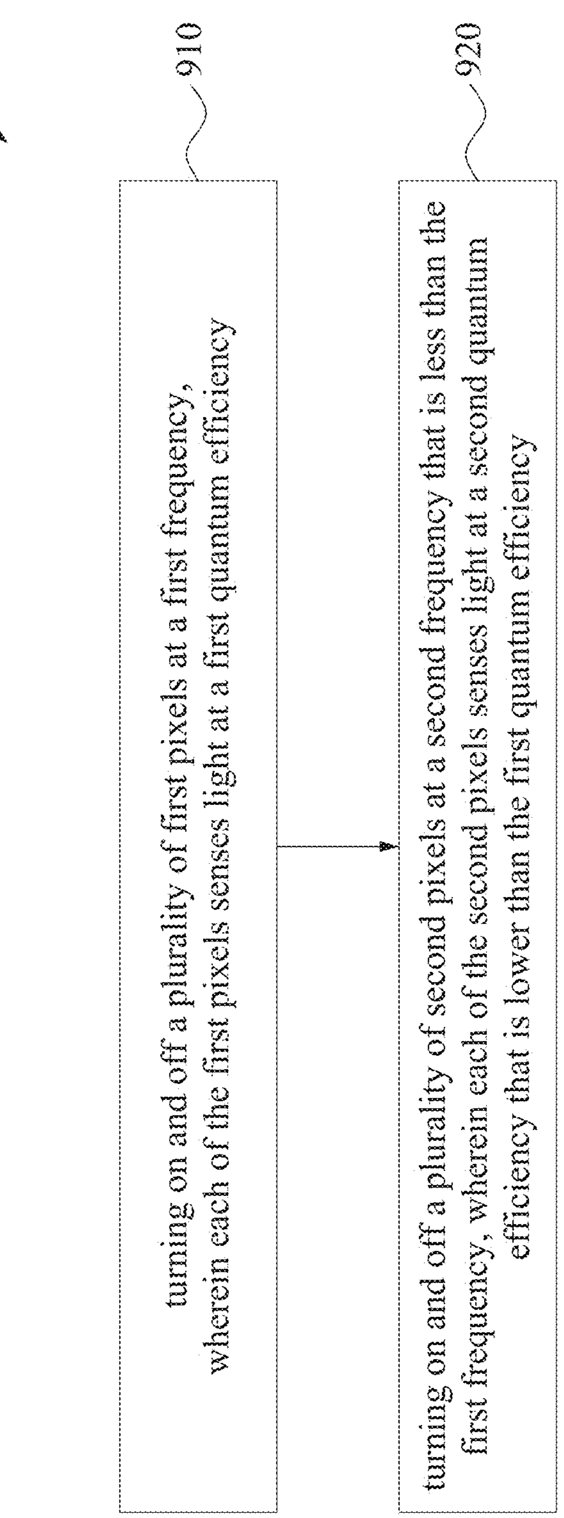
FIG. 9 is a flowchart illustrating a method of operating an image sensor device according to an embodiment of the present disclosure.

FIG. 9 is a flowchart illustrating a method 900 of operating an image sensor device according to an embodiment of the present disclosure. The method 900 includes a step 910, in which a plurality of first pixels is turned on and off at a first frequency. Each of the first pixels senses light at a first quantum efficiency. The method 900 includes a step 920, in which a plurality of second pixels is turned on and off at a second frequency that is less than the first frequency. Each of the second pixels senses light at a second quantum efficiency that is lower than the first quantum efficiency.

In some embodiments, the turning on and off the plurality of first pixels and the turning on and off the plurality of second pixels are performed to sense light emitted by one or more light-emitting diode (LED) devices.

In some embodiments, the first frequency is at least multiple times greater than the second frequency.

In some embodiments, the turning on and off the plurality of first pixels and the turning on and off the plurality of second pixels comprise turning on at least one of the second pixels while all of the first pixels are turned off.

In some embodiments, the plurality of second pixels includes a first second pixel and a second pixel, and wherein the turning on and off the plurality of second pixels comprises: at a first period in time, turning on the first second pixel and turning off the second pixel; and at a second period in time different from the first period in time, turning off the first second pixel and turning on the second pixel. In some embodiments, the turning on and off the plurality of second pixels comprises: turning on at least one of the second pixels at any point in time during an operation of the image sensor device.

It is understood that additional processes may be performed before, during, or after the steps 910-920 of the method 900. For example, the method 900 may include: determining a frequency of the one or more LED devices, and based on the determined frequency of the LED devices, the second frequency is set to be less than ½ of the frequency of the one or more LED devices. Other additional steps are not discussed herein for reasons of simplicity.

In summary, the present disclosure implements "small" pixels on an image sensor device that includes "standard" pixels. The "small" pixels have lower QE than the "standard" pixels. The smaller QE allows the "small" pixels to be turned on substantially longer (i.e., having longer integration times) than the "standard" pixels. The controller of the image sensor device also selectively turns on and off the "small" pixels so as to make sure different ones of the "small" pixels are turned on and off at different points in time. For example, a first "small" pixel may be turned on while a second "small" pixel is turned off, and the first "small" pixel may be turned off while a second "small" pixel is turned on. The frequency at which each "small" pixel is turned on and off is substantially less than a frequency at which each "standard" pixel is turned on and off, as well as less than a frequency at which an LED device is turned on and off to emit light.

Based on the above discussions, it can be seen that the present disclosure offers advantages over conventional image sensor devices. It is understood, however, that other embodiments may offer additional advantages, and not all advantages are necessarily disclosed herein, and that no particular advantage is required for all embodiments. One advantage is the reduction or elimination of the flickering effect. In more detail, the longer integration time (e.g., the "on" period) of the small pixels allows multiple pulses of LED light to be captured. The arrangement in which a first "small" pixel is turned on while a second "small" pixel is turned off (and vice versa) ensures that at least one of the "small" pixels is turned on at all times to capture the LED light. Thus, even during time periods where the "standard" pixel cannot capture the LED light (due to the "standard" pixels being turned off when the LED is emitting light), the "small" pixels can still capture the LED light. As such, the final image captured by the image sensor device is accurate and will not exhibit the flickering effect. In addition to improving the visual appearance, the image sensor devices herein also offers enhanced security and safety, particularly when they are used in automotive applications, such as self-driving vehicles. Another advantage of the present application is that the implementation of the "small" pixels is simple and does not require significant changes to the current image sensor structure or the fabrication thereof. In some embodiments, the present disclosure merely changes the layout design of the grid structure to achieve the "small" pixels with lower QE. In other embodiments, the lower QE of the "small" pixels may be achieved by configuring the implantation processes for forming the photosensitive regions of the pixels, or by using a different color filter for the "small" pixels. As such, the present disclosure is easy and cheap to implement.

One aspect of the present disclosure involves an image sensor device. The image sensor device has a plurality of first pixels. Each of the first pixels is configured to have a first quantum efficiency. The image sensor device has a plurality of second pixels, wherein each of the second pixels is configured to have a second quantum efficiency that is lower than the first quantum efficiency.

Another aspect of the present disclosure involves an image sensor device. The image sensor device has a first number of first pixels disposed in a substrate and a second number of second pixels disposed in the substrate. The first number is substantially equal to the second number. A light-blocking structure is disposed over the first pixels and the second pixels. The light-blocking structure defines a plurality of first openings and second openings through which light can pass. The first openings are disposed over the first pixels. The second openings are disposed over the second pixels. The second openings are smaller than the first openings. A microcontroller is configured to turn on different ones of the second pixels at different points in time.

Yet another aspect of the present disclosure involves a method of operating an image sensor device. The method includes turning on and off a plurality of first pixels at a first frequency. Each of the first pixels senses light at a first quantum efficiency. The method includes turning on and off a plurality of second pixels at a second frequency that is less than the first frequency. Each of the second pixels senses light at a second quantum efficiency that is lower than the first quantum efficiency.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. An image sensor device, comprising:

one or more first pixels disposed in a substrate, wherein side surfaces of the one or more first pixels form one or more first interfaces with the substrate;

one or more second pixels disposed in the substrate, wherein side surfaces of the one or more second pixels form one or more second interfaces with the substrate; and a radiation-blocking structure disposed over the substrate, wherein the radiation-blocking structure defines one or more first openings, and wherein the radiation-blocking structure further defines one or more second openings;

wherein:

in at least one of the first pixels or in at least one of the second pixels, a horizontal dimension thereof increases as the depth thereof increases;

the depth corresponds to a distance from the radiation-blocking structure;

the depth extends in a different direction than the horizontal dimension.

2. The image sensor device of claim 1, wherein each of the first pixels has a different dopant concentration level than each of the second pixels.

3. The image sensor device of claim 2, wherein each of the first pixels has a greater dopant concentration level than each of the second pixels.

4. The image sensor device of claim 1, wherein the first pixels and the second pixels have different geometric shapes in a cross-sectional side view or in a top view.

5. The image sensor device of claim 1, wherein a number of the first pixels disposed in the substrate exceeds a number of the second pixels disposed in the substrate.

6. The image sensor device of claim 1, wherein each of the first pixels has a greater size or a greater quantum efficiency than each of the second pixels.

7. The image sensor device of claim 1, wherein:

each of the first openings is vertically aligned with a respective one of the first pixels;

each of the second openings is vertically aligned with a respective one of the second pixels; and each of the second openings is narrower than each of the first openings in a cross-sectional side view.

8. The image sensor device of claim 1, wherein the radiation-blocking structure includes a plurality of first segments that extend in a first direction in a top view and a plurality of second segments that extend in a second direction in the top view, wherein the second direction is different from the first direction.

9. The image sensor device of claim 1, further comprising a microcontroller configured to selectively activate the one or more second pixels.

10. The image sensor device of claim 9, wherein:

the one or more second pixels include at least a first subset of second pixels and a second subset of second pixels; and the microcontroller is configured to:

activate the first subset of the second pixels while the second subset of the second pixels are deactivated; and activate the second subset of the second pixels while the first subset of the second pixels are deactivated.

11. The image sensor device of claim 1, further comprising a passivation layer disposed over the substrate, wherein the radiation-blocking structure is embedded within the passivation layer.

12. An image sensor device, comprising:

one or more of first pixels disposed in a substrate;

one or more second pixels disposed in the substrate, wherein the first pixels have different geometric shapes from the second pixels in a cross-sectional side view; and a radiation-blocking structure disposed over the substrate, wherein the radiation-blocking structure defines one or more first openings, and wherein the radiation-blocking structure further defines one or more second openings.

13. The image sensor device of claim 12, wherein:

at least one of the second pixels has non-uniform widths; or each of the first pixels has a different dopant or a different doping concentration level than each of the second pixels.

14. The image sensor device of claim 12, further comprising a microcontroller configured to turn on different subsets of the second pixels at different time periods, and wherein:

the second pixels include a first subset and a second subset;

during a first time period, the microcontroller turns on the first subset of the second pixels and turns off the second subset of the second pixels; and during a second time period different from the first time period, the microcontroller turns off the first subset of the second pixels and turns on the second subset of the second pixels.

15. The image sensor device of claim 12, further comprising:

a first isolation structure disposed between an adjacent pair of first pixels; and a second isolation structure and a third isolation structure disposed between one of the first pixels and an adjacently-located second pixel.

16. An image sensor device, comprising:

a first number of first pixels disposed in a substrate;

a second number of second pixels disposed in the substrate, wherein the first number is substantially greater than or equal to the second number;

a light-blocking structure disposed over the first pixels and the second pixels, wherein the light-blocking structure defines a plurality of first openings and second openings through which light can pass, wherein the first openings are disposed over the first pixels, wherein the second openings are disposed over the second pixels, and wherein the second openings have different sizes than the first openings; and a microcontroller configured to turn on different ones of the second pixels at different points in time, wherein the microcontroller is configured to turn on the different ones of the second pixels such that:

a first subset of second pixels is turned on while a second subset of the second pixels is turned off; and the first subset of second pixels is turned off while the second subset of the second pixels is turned on.

17. The image sensor device of claim 16, wherein:

each of the first pixels is doped differently than each of the second pixels; or each of the first pixels is sized differently than each of the second pixels.

18. The image sensor device of claim 16, wherein at least one of the second pixels has a width that changes as a function of a depth.

19. The image sensor device of claim 12, wherein:

at least one of the first pixels or at least one of the second pixels has a first portion and a second portion that is located closer to the radiation-blocking structure than the first portion in the cross-sectional side view;

the first portion has a first width in the cross-sectional side view;

the second portion has a second width in the cross-sectional side view; and the second width is smaller than the first width.

20. The image sensor device of claim 12, wherein side surfaces of the one or more first pixels form one or more first interfaces with the substrate, and wherein side surfaces of the one or more second pixels form one or more second interfaces with the substrate.

* * * * *